(12) United States Patent  
Schelmbauer

(10) Patent No.: US 7,605,657 B2  
(45) Date of Patent: Oct. 20, 2009

(54) MULTI-MODE AMPLIFIER ARRANGEMENT AND METHOD FOR CONTROLLING AN AMPLIFIER ARRANGEMENT

(75) Inventor: Werner Schelmbauer, Linz (AT)

(73) Assignee: Infineon Technologies AG, Neubiberg (DE)

( * ) Notice: Subject to any disclaimer, the term of this patent is extended or adjusted under 35 U.S.C. 154(b) by 157 days.

(21) Appl. No.: 11/751,946

(22) Filed: May 22, 2007

(65) Prior Publication Data

US 2008/0290943 A1 Nov. 27, 2008

(51) Int. Cl.  
*H03F 3/45* (2006.01)

(52) U.S. Cl. .................. 330/260; 330/258; 330/261

(58) Field of Classification Search .......... 330/253, 330/258, 260, 261  
See application file for complete search history.

(56) References Cited

U.S. PATENT DOCUMENTS 6,985,036 B2 * 1/2006 Bhattacharjee et al. ...... 330/253  
7,154,329 B2   12/2006 Douglas  
7,233,204 B2 * 6/2007 Kim et al. ................... 330/260

* cited by examiner

*Primary Examiner*—Khanh V Nguyen  
(74) *Attorney, Agent, or Firm*—Eschweiler & Associates, LLC

(57) ABSTRACT

A multi-mode amplifier arrangement comprises an amplifier having a plurality of field effect transistors selectable in response to a control signal at a control terminal, said plurality of field effect transistors coupled to an input terminal to receive a signal to be amplified, said amplifier arranged between a supply terminal and a ground terminal. A tunable current source is coupled to the amplifier to provide in operation of the amplifier a constant drain current through the plurality of field effect transistors.

24 Claims, 5 Drawing Sheets

US 7,605,657 B2

MULTI-MODE AMPLIFIER ARRANGEMENT AND METHOD FOR CONTROLLING AN AMPLIFIER ARRANGEMENT

FIELD OF INVENTION

The invention relates to an improved multi-mode amplifier arrangement usable in different applications. The invention also relates to a method for controlling an amplifier arrangement.

BACKGROUND

In modern electronic applications, amplifiers and amplifier arrangements are used to amplify a variety of signals. Depending on the application and the field of use, the amplifier or amplifier arrangement shall fulfill different requirements regarding, for instance, linearity, noise, signal quality or power consumption. For each of those applications and requirements, different amplifiers are known in the prior art.

Still, there is a desire to further improve amplifiers and amplifier arrangements.

BRIEF DESCRIPTION OF THE DRAWINGS

The invention is explained in detail below using exemplary non-limiting embodiments with reference to the drawings in which.

DETAILED DESCRIPTION

Figure 1:
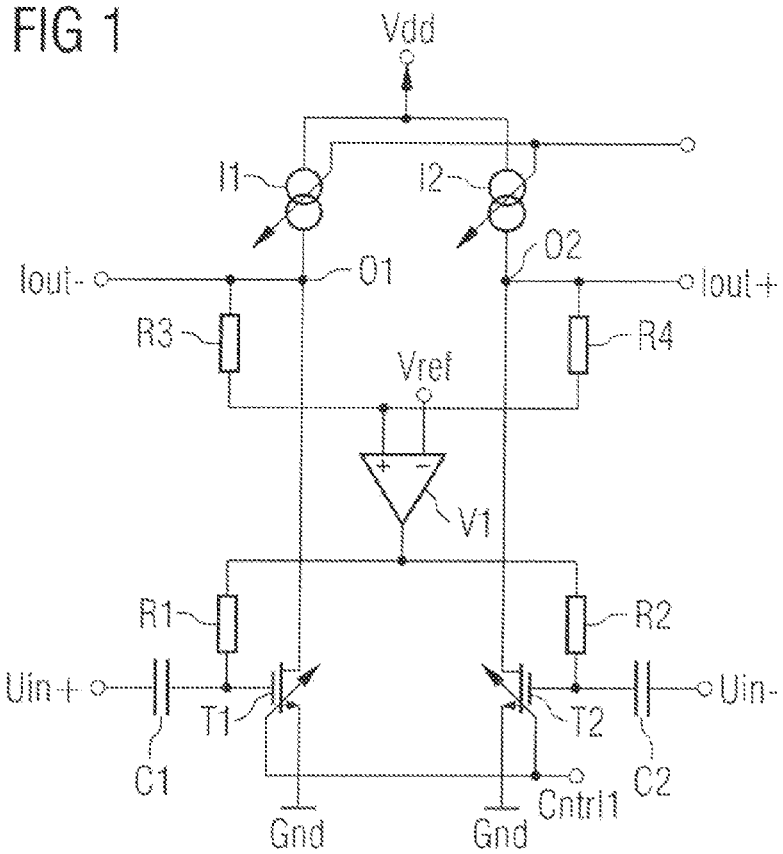
FIG. 1 is a schematic diagram illustrating a first embodiment of an amplifier with an improved dynamic range.

In the following description, further aspects and embodiments of the present invention are disclosed. In addition, reference is made to the accompanying drawings which form a part hereof, and which illustrate various embodiments in which the invention may be practiced. The embodiments of the drawings present a discussion in order to provide a better understanding of one or more aspects of the present invention. The disclosure is not intended to limit the feature or key elements of the invention to a specific embodiment. Rather, the different elements, aspects and features disclosed in the embodiments can be combined in different ways by a person skilled in the art to achieve one or more advantages of the present invention. It is to be understood that other embodiments may be utilized and structural or logical changes may be made or applied without departing from the scope of the invention. The elements of the drawings are not necessarily to scale relative to each other. For illustration purposes, the embodiments are shown with differential signal processing. It is clear for a person skilled in the art that the different aspects of the present invention can be realized with balanced signal processing as well as with single-ended structures. In this respect the used term "differential amplifier" may also include "balanced amplifiers". Furthermore, different features and elements of the various embodiments can be replaced by equivalent elements without departing from the scope of the present invention. Like reference numerals designate corresponding similar parts.

FIG. 1 shows an embodiment of an amplifier arrangement with an improved dynamic range. The term "improved dynamic range" refers to the dynamic range in which the amplifier of the embodiment according to FIG. 1 is usable. Generally, an amplifier is supplied by a specific supply current in its operation. The supply current determines a size of a dynamic window within the transfer characteristic of the amplifier. By changing the current, the windows size can be varied as well. The position of the dynamic window within the transfer characteristic is mostly pre-determined by the structure and the size of the amplification transistors. In addition, the transfer characteristic may slightly vary, if some elements of the amplifiers are varied or even replaced by other elements.

On the other hand, external parameters may require a specific window size and position of the window, meaning that the amplifier is operated in a specific area of its transfer characteristic. When changing one external parameter, for instance the supply current, other parameters may vary. Consequently, the size of the dynamic window and its position within the transfer characteristic are often linked together so that one influences the other.

The embodiment according to FIG. 1 allows selecting the size of the amplification transistors independently of the supply or drain current, resulting in a selection of the dynamic window position without changing the dynamic window itself. The differential amplifier comprises a signal transfer function and is operated in an interval of the transfer function. With the control signal the position of the interval corresponding to the window can be changed. So the position can be adapted to a desired position, required or useful for instance to amplify signals according to a specific communication standard. Additionally, the current source provides a substantially constant current through the differential amplifier independent of the position of the interval or of a change of the position. Still, the current provided by the source can be independently selected to vary the size of the interval of the signal transfer function.

The amplifier arrangement comprises a differential or balanced amplifier with two amplification transistor arrangements T1 and T2 coupled with their source terminals to a common first potential terminal GND and with their drain terminals to a respective tunable current source I1, I2. The current sources I1, I2 are connected to the second potential terminal VDD for a supply voltage. The gate terminals of the transistor arrangements T1, T2 are configured to receive the balanced input signal Uin+, Uin−, respectively. To decouple any undesired DC signal portion, each gate terminal of the transistor arrangements T1 and T2 are connected to a respective capacitor C1 and C2.

The embodiment according to FIG. 1 is a multi-mode voltage/current amplifier. The drain currents through the transistor arrangements T1, T2 are provided by the tunable current sources I1, I2. The drain current itself is independent from the configuration of the transistor arrangements T1, T2. More over, it may be changed by tuning the current sources I1, I2. As a result, the configuration and, more particularly, the length or the width amplification transistors of the transistor arrangements T1, T2 can be selected independently from the drain current provided by the current sources I1, I2.

The output terminals between the drain terminals of the transistor arrangements T1, T2 and the output terminals of the current sources I1, I2 are configured to provide the amplified balanced output signals Iout−, Iout+ at terminals O1 and O2, respectively. A feedback loop is provided to control the common mode voltage to the transistor arrangements T1 and T2. The control circuit also selects the corresponding operating point for the amplification transistor arrangements T1, T2. For this purpose, the output terminals O1, O2 are coupled together via the two resistors R3 and R4, respectively. A node between the resistors is connected to a comparator V1. The second input terminal of the comparator V1 is connected to a reference potential Vref. The output of comparator V1 is coupled via the resistors R1, R2 to the corresponding gate terminals of the transistor arrangements T1, T2.

Figure 5:
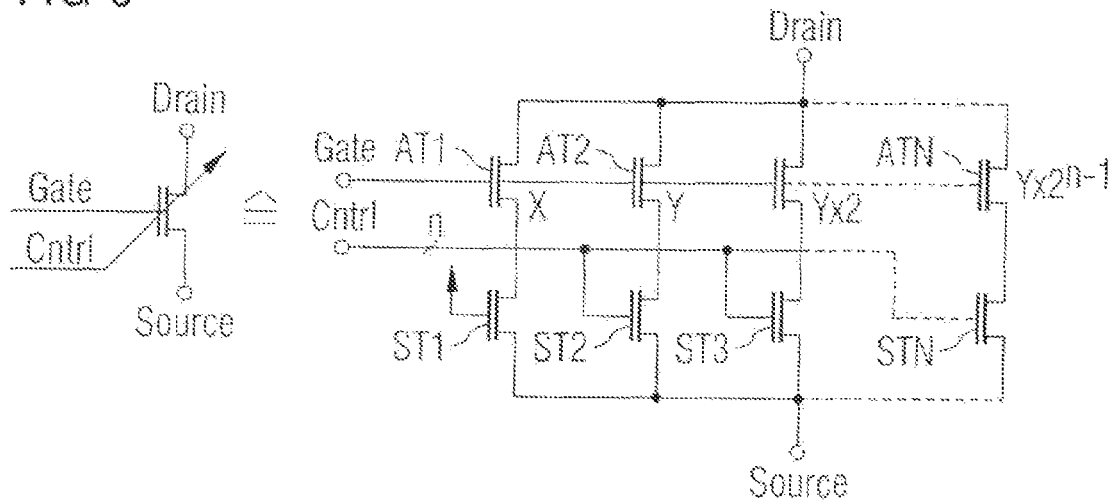
FIG. 5 is a schematic diagram illustrating an embodiment of an amplification transistor arrangement with a plurality of different selectable transistors.

The transistor arrangement T1, T2 comprises a plurality of digitally selectable field-effect transistors. FIG. 5 shows one example embodiment for such amplification transistor arrangement. The transistor arrangement comprises a plurality of parallel arranged amplifier transistors AT1, AT2, AT3 to ATN, each of them coupled with its first terminal to a common drain terminal and with its second terminal to a respective switching transistor ST1, ST2, St3 to STN. The second terminal of the switching transistors is connected to a common source terminal. The switching transistors ST1, ST2, St3 to STN are coupled with their gate terminals to the control input terminal for the control word Cntrl. The gate terminals of the amplifier transistors AT1, AT2, AT3 to ATN are connected to a common gate terminal, on which the signal to be amplified can be applied.

Each of the amplifier transistors AT1, AT2, AT3 to ATN comprises a specific gate length as well as a gate width X or Y. Due to the parallel arrangement of the amplifier transistors in this embodiment, the effective gate width can be selected by activating or deactivating the respective switching transistors ST2, ST3 to STN. For example, the first amplifier transistor AT1 comprises the gate width X and a gate length. The second terminal of the first amplifier transistor AT1 is connected to the first switching transistor ST1, coupled with its gate input terminal to a constant potential, thereby activating the switching transistor ST1. Via the control word Cntrl, the switching transistors ST2, ST3 to STN are selectively activated, thereby adding an additional amplification branch in parallel to the first amplification transistor AT1. The additional amplification transistors AT2, AT2 to ATN may comprise the same gate length and width as the first amplification transistor 81. They may also comprise a different width, for instance a smaller width to achieve a more precise amplification gain setting. They may also comprise different gate width to obtain a higher flexibility.

In one embodiment, the amplification transistors AT2, AT3 to ATN comprise the gate width Y. Consequently, by adding additional amplification transistors AT2, AT3 to ATN to the arrangement consecutively, the additional gate width added is the gate width multiplied by the number of added amplification transistors. The additional amplification branches change the position and, more particularly, adjust and rearrange the dynamic window within the transfer characteristic of the amplifier arrangement.

Figure 8:
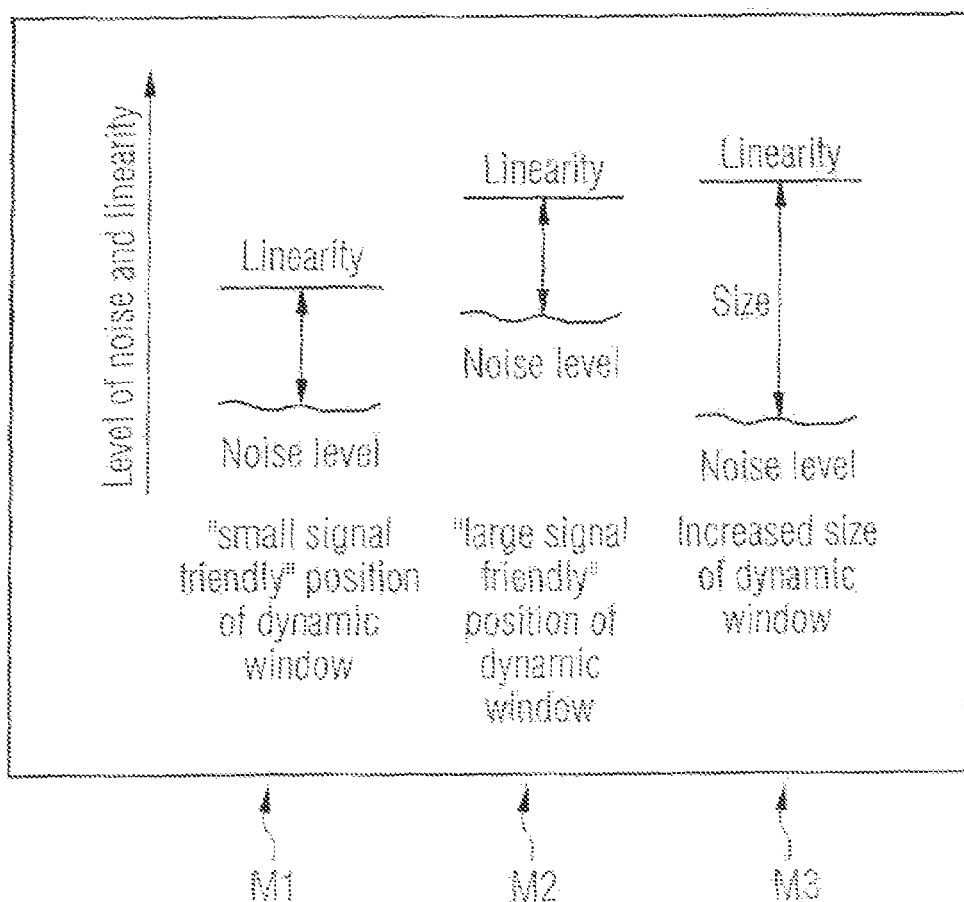
FIG. 8 is a graph illustrating a transfer characteristic of an amplifier having an improved dynamic range.

FIG. 8 shows a diagram illustrating the transfer characteristic of an amplification transistor arrangement and a possible window size and window position of the arrangement in different operations. Window size is set by the drain current through the amplifier arrangement while the position of the dynamic window can be varied by selecting a configuration out of a plurality of possible configurations of the transistor arrangement. In the diagram, three different modes of operation are shown. For the first mode of operation it is assumed that the input signal to be amplified is small. The window size, illustrated by the distance between the noise level as lower end and the linearity level as the upper end is adjusted in response to the current through the amplifier. The upper level is called linearity border, because input signals with higher levels may cause distortion in the amplifier. Depending on the level input signal of the input signal, the window position can be shifted as seen in the operation mode M2. In this case the input signal is higher, while the window size has not changed. In the third mode of operation M3, the dynamic window size and its position have changed. Consequently, the amplifier is capable of processing high dynamic input signals with a better signal/noise ratio and without distorting the output signal even at high level input signals.

Figure 2:
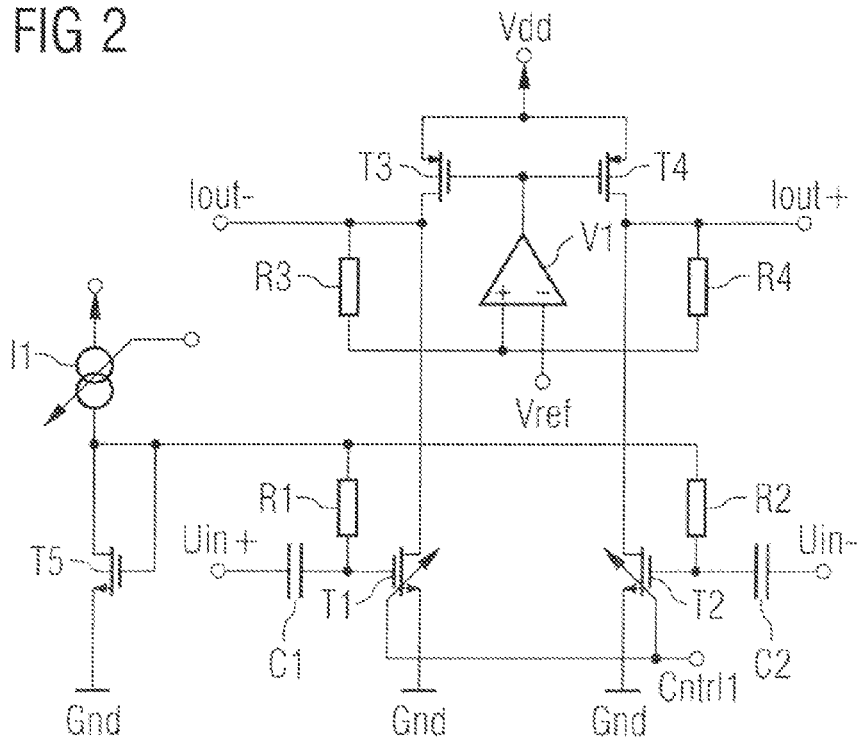
FIG. 2 is a schematic diagram illustrating a second embodiment of an amplifier with an improved dynamic range.

FIG. 2 shows a different embodiment of a balanced amplifier with an improved and selectable dynamic window. In this embodiment, the amplifier transistor arrangements T1 and T2 of the differential amplifier are coupled with their source terminals to the ground potential GND and with their drain terminals to respective field-effect transistors T3 and T4. The field-effect transistors T3, T4 provide a supply drain current for the amplifier transistor arrangements T1, T2. The gate terminals of the supply transistors T3, T4 are connected to an output terminal of a comparator V1 comparing the common mode voltage of the output signal with a reference potential Vref. In this embodiment, the drain current through the amplifier transistor arrangements may be dependent on the configuration of the amplifier transistor arrangements T1, T2. To compensate for this dependency, the gates of the amplifier transistor arrangements are connected to resistors R1 and R2, which form a part of a current mirror with a mirror transistor T5. The gate of the current mirror transistor T5 is coupled to its drain terminal and to the resistors R1, R2. The current through the current mirror transistor T5 is provided by a tunable current source I1. With an appropriate setting, the current source I1 provides a constant current through the current mirror transistor T5 resulting in an independent and constant drain current through the amplifier transistor arrangements T1, T2. In addition, the tuning of the current source I1 is used to select the size of the dynamic window of the amplifier arrangement according to the embodiment of FIG. 2.

Figure 3:
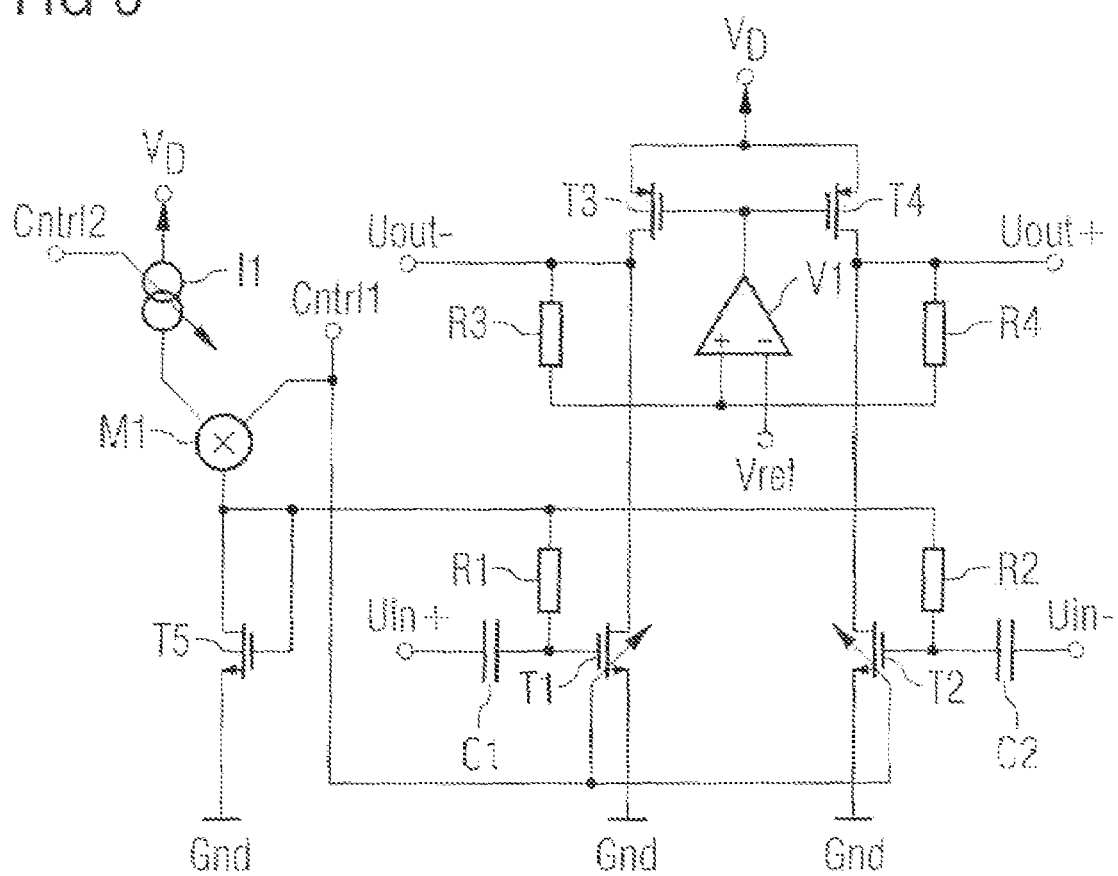
FIG. 3 is a schematic diagram illustrating a modification of the second embodiment of an amplifier.

FIG. 3 shows a modification of the embodiment according to FIG. 2. In this embodiment, the current source I1 provides the constant current for the current mirror setting the common mode voltage in the amplifier transistor arrangement T1, T2. A multiplier element M1 is arranged between the current source I1 and the current mirror transistor T5. A second input of the multiplier element M1 is configured to receive the control word Cntrl1. The control word is also used to select a configuration of the amplifier transistor arrangements T1, T2. The supply current by the current source I1 is multiplied with a corresponding factor derived by the control word Cntrl1.

When the configuration of the amplifier transistor arrangements T1, T2 changes, the drain current through the amplifier transistor arrangements varies as well. To compensate this change and keep the drain current constant, the current provided by the current source I1 is multiplied by a compensation factor derived by the first control word Cntrl1. Consequently, any length or width changes within the amplifier transistor arrangement are still independent from the DC current through the arrangement.

Figure 4:
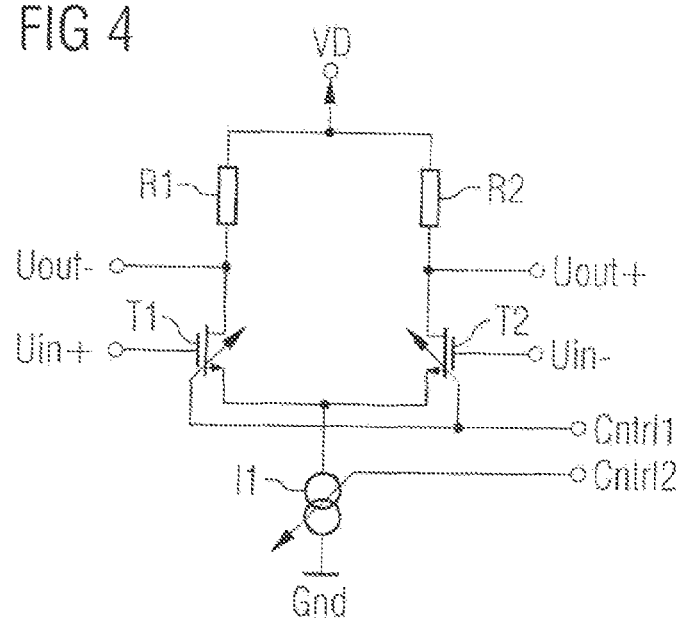
FIG. 4 is a schematic diagram illustrating a third embodiment of an amplifier with an improved dynamic range.

FIG. 4 shows a further embodiment of a differential amplifier, in which the size and the position of the dynamic window can be selected independently from each other. The differential amplifier comprises a first transistor arrangement T1 having a plurality of digitally selectable field-effect transistors. A second transistor arrangement T2 also comprising a plurality of digitally selectable field-effect transistors is connected with its source terminal to an output of a tunable common current source I1. The current source is connected to the transistor arrangement T1 as well. The drain terminals of the amplifier transistor arrangements T1, T2 are coupled to the output terminals Uout−, Uout+ and to resistors R1, R2. The resistors are connected to a common drain potential.

The drain current through the amplifier transistor arrangements T1, T2 are similar and independent from the input signal Uin− and Uin+. The position of the dynamic window of the differential amplifier is set by the control word Cntrl1, which selects an amplification transistor configuration out of a plurality of possible configurations of the amplifier transistor arrangements T1, T2. The second control word Cntrl2 is used to tune the total current through the transistor arrangements T1, T2 and therefore to select the size of the dynamic window.

Figure 6:
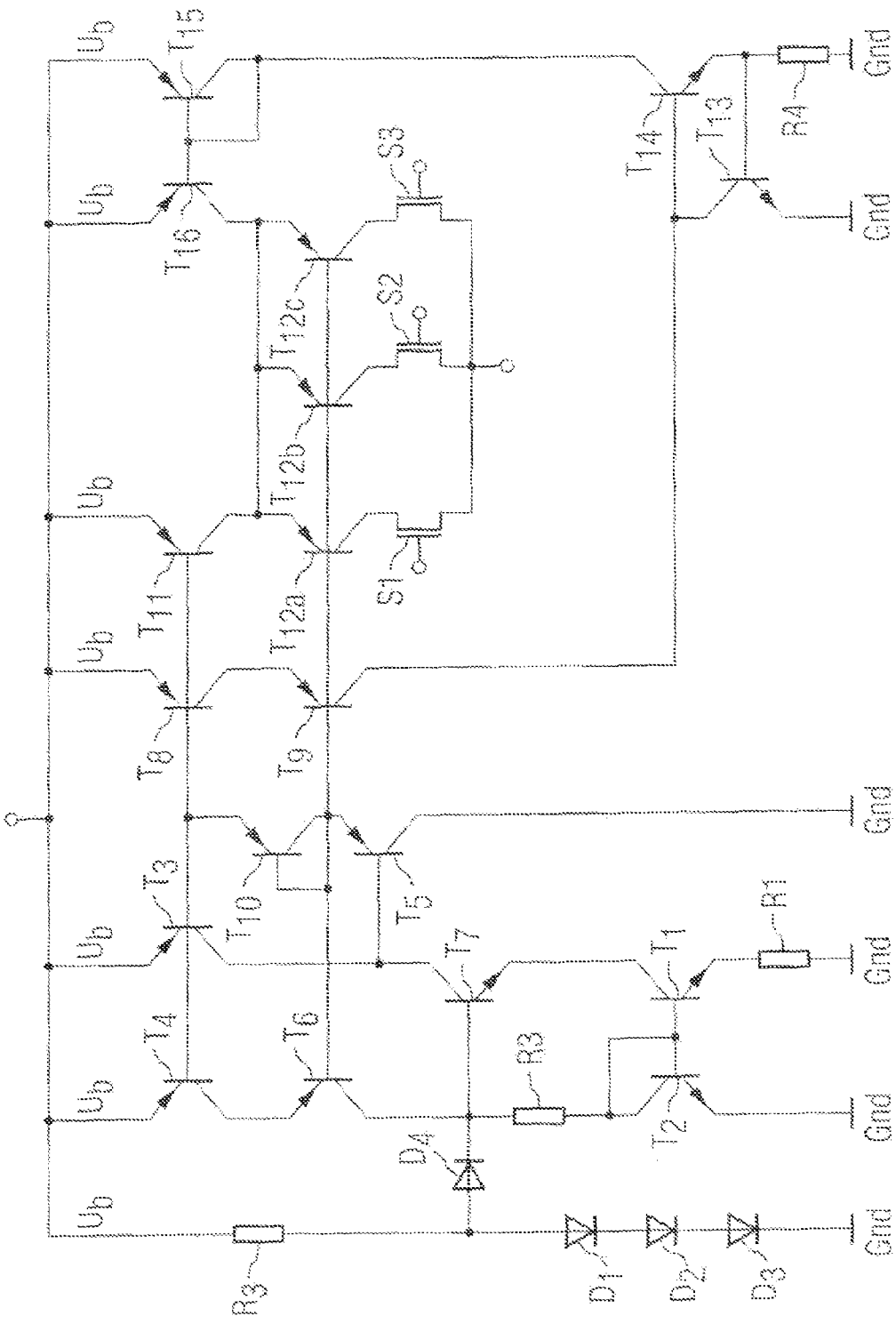
FIG. 6 is a schematic diagram illustrating an embodiment of a current source with a selectable output current.

FIG. 6 illustrates one embodiment of a tunable current source. The current source comprises two reference current sources, each of them having a specific temperature dependency which compensates each other. As a result, the current source according to the embodiment of FIG. 6 is temperature independent. The left part of the current source corresponds to a PTAT-reference current source. The term "PTAT" refers to the feature of a current source providing a current proportional to absolute temperature. The PTAT-portion of the current source comprises a first branch having three diodes $D_1$ to $D_3$ connected in series to a resistor R3. Between the first diode $D_1$ and the resistor R3, a first node is provided connected to a fourth diode $D_4$. The output of the fourth diode $D_4$ is coupled to a terminal of the transistor T7 and a resistor R2. The diodes $D_1$ to $D_3$ and the first resistor R3 form a first reference voltage source providing a start current for the transistor T1 via the diode $D_4$ and the resistor R2. The resistance of R2 is similar to the resistance of the resistor R1 connected to the source terminal of transistor T1.

The output of the resistor R2 is connected to the drain terminal of a current mirror transistor T2, whose gate is connected to transistor T1 and to a node between a resistor R2 and its drain terminal. The output of the diode $D_4$ is also connected to transistor T6 forming a series circuit together with transistor T4. Transistor T7 connected to the drain terminal of transistor T1 operates as a cascade transistor, using the start potential as a pre-voltage. The current mirror of the transistors T4, T3 and T8 is extended to a three transistor current mirror together with a transistor diode D10 and the transistor T5. The use of the transistor diode D10 reduces the base current induced errors.

The emitter followers of the transistors T8 and the cascode transistor T9 is coupled with its source terminal to the gate terminal of the transistor T14 and the drain terminal of transistor T13, forming the second portion of the reference current source. The second portion is supplied by an already stabilized current and does not need any feedback loop using an additional current mirror. The reference current source further comprises the transistor T11 and a plurality of transistors T12a to T12c connected to the output terminal of the transistor T11.

The plurality of the transistors T12a to T12c are coupled to a second current mirror comprising the transistors T16 and T15, on which the current of the second portion of the reference current source is added. Additional transistors S1 to S3 coupled to the source terminals of the plurality of transistors T12a to T12c are used to selectively switch each of the plurality of transistors to a common output terminal. As a result, the current source according to the embodiment of FIG. 6 provides a tunable constant and temperature independent output current. The total output current can be selected by corresponding control signals at the terminals of the switching transistors S1 to S3.

Figure 7:
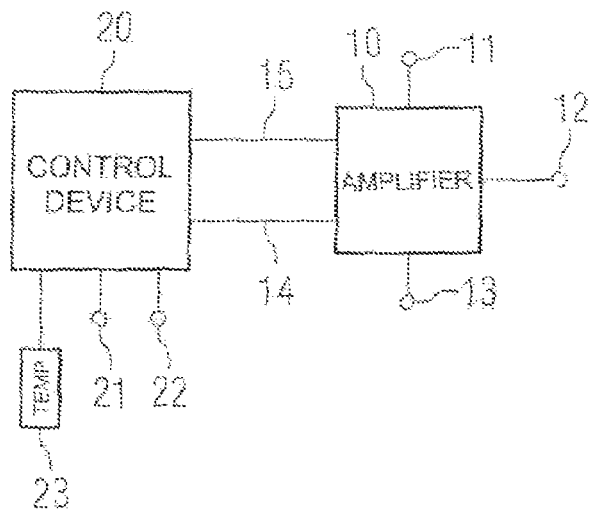
FIG. 7 is a block diagram illustrating an embodiment of an arrangement with an amplifier comprising an improved dynamic range.

The amplifier and amplifier arrangements according to the embodiments illustrated herein can be used in a variety of different applications. FIG. 7 shows an embodiment in which the amplifier arrangement is used to amplify a high-frequency signal on a specific radio frequency. The radio frequency and the signal to be amplified may comprise a modulated signal having a data content corresponding to a mobile communication standard. For example, the amplifier 10 may be used to amplify signals according to the GSM, the EDGE, wideband CDMA, or the Bluetooth mobile communication standard. Other communication standards like, for example, IEEE802.11 or any kind of WLAN standards can be used as well. In a telecommunication system, amplifier arrangements may be used to amplify signals not only for a specific standard but also to include multi-mode capabilities. The term "multi-mode capabilities" means that the amplifier or amplifier arrangements are capable of amplifying signals according to one or more mobile communication standards.

For example, the mobile communication standard in GSM uses a phase modulated signal for data transmission or receiving. On the other hand, the mobile communication standards EDGE or wideband CDMA use amplitude and phase modulated signals for data transmission and reception. Consequently, the requirements regarding linearity and signal-to-noise ratio differ from each other. As a result, the dynamic window in the transfer characteristic of the amplifier for signals according to the GSM mobile communication standard is different from the dynamic window for signals according to the wideband CDMA or the EDGE standard.

With the possibility to select the position of the dynamic window as well as the size of the dynamic window independently of each other, an amplifier or an amplifier arrangement according to the embodiments illustrated herein can be used as a multi-mode voltage/current amplifier. Furthermore, process or any external parameter variation resulting in a position transformation of the dynamic window as well as in a changing of the dynamic window's size can be compensated. In particular, the dynamic window may be adjusted to the requirements for the signals to be amplified. This may not only increase the signal quality of the amplified signals but also reduces the overall current consumption.

For this purpose, the amplifier arrangement 10 comprises a signal input terminal 13 for a signal to be amplified and an output terminal 12, on which the amplified signal is provided. For the selection of the dynamic window and the dynamic size, the amplifier arrangement 10 comprises two more control terminals 14 and 15, respectively. A signal applied to the control terminal 14 is used to adjust the current source keeping the drain current through the amplifier transistors constant. Signals provided at the second control terminal 15 select one configuration out of a plurality of possible configurations of the amplifier transistor arrangement within the amplifier 10.

The arrangement further comprises a control device 20. The control device 20 may comprise one or more input terminals for providing different input signals. For example, the control device 20 may comprise an input terminal connected to a temperature sensor 23 to receive a temperature dependent signal. Such temperature dependent signal may compensate temperature dependent effects of the current source or the configuration of the amplifier arrangement 10. In addition, two more input terminals 21, 22 are adopted to receive control data indicating the mobile communication standard for the signals to be amplified as well as the total output power. Dependent on the mobile communication standard for the signals to be amplified, the size of the dynamic window as well as the position may vary as described above. In addition, the total output power may also have influence on the size and the position of the dynamic window. Consequently, the control device 20 processes the input data and generates a control signal for the required window size as well as for the window position.

If external parameters like the temperature or the data content of the signal to be amplified changes, the dynamic window size and the dynamic window position are adjusted accordingly. The embodiment according to FIG. 7 may be used as an amplifier in a transmitter device as well as an amplifier in a receiver device. For example, amplifier arrangement 10 can be used as a low noise amplifier to amplify received signals in a mobile communication device. Furthermore, the amplifier arrangement 10 may be part of a mixer device or a polar modulator.

Although specific embodiments have been illustrated and described herein, it will be appreciated by those of ordinary skill in the art, that any arrangement which is calculated to achieve the same purpose may be substituted for the specific embodiments shown. It is to be understood, that the above description is intended to be illustrative and not restrictive. This application is intended to cover any adaptations or variations of the invention. Combinations of the above embodiments and many other embodiments will be apparent to those of skill in the art upon reading and understanding the above description. The scope of the invention includes any other embodiments and applications in which the above structures and methods may be used. The scope of the invention should, therefore, be determined with reference to the appended claims along with the scope of equivalents to which such claims are entitled.

It is emphasized that the abstract is provided to comply with 37cfr. section 1.72(b) requiring an abstract that will allow the reader to quickly ascertain the nature and gist of a technical disclosure. It is submitted with the understanding that it will not be used to interpret or limit the scope of meaning of the claims.

The invention claimed is:

1. A multi-mode amplifier arrangement, comprising:
an amplifier transistor arrangement comprising: a plurality of parallel amplifier field effect transistors and a plurality of parallel switching field effect transistors; the switching field effect transistors respectively in series with the amplifier field effect transistors and selectable in response to a control signal at a control terminal, and the plurality of amplifier field effect transistors coupled to an input terminal to receive a signal to be amplified, wherein the amplifier transistor arrangement is arranged between a supply terminal and a ground terminal; and
a tunable current source coupled to the amplifier transistor arrangement and configured to provide a substantially constant drain current through the amplifier transistor arrangement.

2. The amplifier arrangement of claim 1, wherein the tunable current source is disposed between the supply terminal and the amplifier transistor arrangement.

3. The amplifier arrangement of claim 1, wherein the tunable current source is disposed between the ground terminal and the amplifier transistor arrangement.

4. The amplifier arrangement of claim 1, wherein the tunable current source is coupled to a first terminal of a current mirror transistor, and wherein the current mirror transistor is connected with its gate terminal to a first terminal that is coupled to the amplifier transistor arrangement.

5. The amplifier arrangement of claim 1, wherein the control terminal comprises a plurality of control lines that are coupled to respective gate terminals of the plurality of switching field effect transistors.

6. The amplifier arrangement of claim 1, wherein a field effect transistor is disposed between the amplifier transistor arrangement and the supply terminal, and wherein a gate terminal of the field effect transistor is coupled to a common mode control circuit.

7. The amplifier arrangement of claim 1, wherein the tunable current source comprises a current mirror with at least two output transistors that are selectable in response to a selection signal.

8. The amplifier arrangement of claim 1, wherein the amplifier transistor arrangement comprises a differential amplifier.

9. The amplifier arrangement of claim 1, further comprising a control circuit configured to provide the control signal and a tuning signal applied to the tunable current source in response to at least one parameter, wherein the at least one parameter is derived from the manner or type of the signal to be amplified.

10. The amplifier arrangement of claim 9, wherein the at least one parameter comprises a mobile communication standard, a desired RMS output power of the signal to be amplified, or the modulation type of the signal to be amplified.

11. A multi-mode amplifier arrangement, comprising:
a differential amplifier coupled between a first supply terminal and a second supply terminal, the differential amplifier comprising a plurality of field effect transistors that are selectable in response to a first control signal;
a current source configured to provide a selectable output current in response to a second control signal, wherein the current source is coupled to the differential amplifier and configured to provide a constant current through the selected plurality of field effect transistors, wherein the current source comprises:
a first tunable source disposed between the first supply terminal and a first branch of the differential amplifier, and
a second tunable source disposed between the first supply terminal and a second branch of the differential amplifier.

12. The amplifier arrangement of claim 11, wherein the plurality of field effect transistors are arranged in a network, wherein at least one field effect transistor is selectable in response to the first control signal.

13. The amplifier arrangement of claim 11, wherein the current source is disposed between the second supply terminal and a common node of a first and a second branch of the differential amplifier.

14. A multi-mode amplifier arrangement, comprising:
a differential amplifier having a signal transfer function, wherein the differential amplifier is configured to operate in an interval of the signal transfer function, the differential amplifier comprising a tuning input terminal configured to receive a signal to change the position of the interval of the signal transfer function;
a tunable current source coupled to the differential amplifier, and configured to provide a current through the differential amplifier that is substantially independent of the position of the interval, wherein the current changes the size of the interval of the signal transfer function.

15. The amplifier arrangement of claim 14, wherein the tunable current source is coupled to drain terminals of amplification field effect transistors of the differential amplifier, and is configured to provide a drain current through the field effect transistors.

16. The amplifier arrangement of claim 14, wherein the tunable current source is coupled to a common node of the differential amplifier, wherein the common node is connected to respective source terminals of a plurality of field effect transistors of the differential amplifier.

17. A method for controlling an amplifier arrangement to operate in at least two different operation modes, comprising:
providing a differential amplifier having a signal transfer function, and comprising a plurality of selectable field effect transistors;
providing a tunable current source operably associated with the differential amplifier;
providing a supply current to supply the differential amplifier;
selecting an interval of the signal transfer function by selecting at least one of the field effect transistors of the plurality of field effect transistors; and
selecting a size of the interval of the signal transfer function by tuning the current source,
wherein selecting the interval is independent from selecting the size of the signal transfer function.

18. The method of claim 17, wherein selecting the interval comprises changing a selection of the at least one field effect transistor without tuning the current source.

19. The method of claim 17, wherein selecting the interval size comprises changing an output current of the tunable current source without changing the selection of the at least one field effect transistors of the plurality of field effect transistors.

20. The method of claim 17, wherein selecting an interval comprises changing the tunable current source in response thereto so as to keep the supply current through the differential amplifier substantially constant.

21. The method of claim 17, wherein the tunable current source provides the supply current in the at least two different operation modes of the amplifier arrangement.

22. The method of claim 17, wherein the differential amplifier comprises a balanced amplifier.

23. A multi-mode amplifier arrangement, comprising:
an amplifier comprising a plurality of field effect transistors selectable in response to a control signal at a control terminal, the plurality of field effect transistors coupled to an input terminal to receive a signal to be amplified, wherein the amplifier is arranged between a supply terminal and a ground terminal; and
a tunable current source coupled to the amplifier and configured to provide a substantially constant drain current through the selected plurality of field effect transistors; wherein the tunable current source is coupled to a first terminal of a current mirror transistor, and wherein the current mirror transistor is connected with its gate terminal to a first terminal that is coupled to the amplifier.

24. A multi-mode amplifier arrangement, comprising:
a differential amplifier coupled between a first supply terminal and a second supply terminal, the differential amplifier comprising a plurality of field effect transistors that are selectable in response to a first control signal;
a current source configured to provide a selectable output current in response to a second control signal, wherein the current source is coupled to the differential amplifier and configured to provide a constant current through the selected plurality of field effect transistors, wherein the current source is also coupled to a first terminal of a current mirror transistor, wherein the current mirror transistor is connected with its gate terminal to the first terminal, and wherein the first terminal is coupled to respective gate terminals of the plurality of field effect transistors of the differential amplifier.

* * * * *